United States Patent
Chen et al.

(10) Patent No.: US 7,316,970 B2
(45) Date of Patent: Jan. 8, 2008

(54) METHOD FOR FORMING HIGH SELECTIVITY PROTECTION LAYER ON SEMICONDUCTOR DEVICE

(75) Inventors: Chien-Hao Chen, Jhuangwei Township, Yilan County (TW); Ju-Wang Hsu, Taipei (TW); Chia-Lin Chen, Hsinchu (TW); Tze-Liang Lee, Hsinchu (TW); Shih-Chang Chen, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 62 days.

(21) Appl. No.: 10/892,014

(22) Filed: Jul. 14, 2004

(65) Prior Publication Data

US 2006/0014396 A1     Jan. 19, 2006

(51) Int. Cl.
    *H01L 21/425*     (2006.01)
(52) U.S. Cl. .................. 438/530; 438/757; 438/791
(58) Field of Classification Search ................. 438/530, 438/757, 791
    See application file for complete search history.

(56) References Cited

U.S. PATENT DOCUMENTS

| | | | |
|---|---|---|---|
| 5,792,684 A | * 8/1998 | Lee et al. | 438/238 |
| 5,962,344 A | * 10/1999 | Tu et al. | 438/694 |
| 6,093,593 A | 7/2000 | Jang | 438/221 |
| 6,187,655 B1 | 2/2001 | Wang et al. | 438/528 |
| 6,346,449 B1 | 2/2002 | Chang et al. | 438/305 |
| 6,348,389 B1 | 2/2002 | Chou et al. | 438/305 |

OTHER PUBLICATIONS

Wolf and Tauber; Silicon Processing for the VLSI Era vol. 1: Process Technology; Lattice Press; 1986; Sunset Beach, CA; pp. 169 and 194.*

* cited by examiner

*Primary Examiner*—Fernando L. Toledo
(74) *Attorney, Agent, or Firm*—Duane Morris LLP (57) ABSTRACT

A method for forming a resist protect layer on a semiconductor substrate includes the following steps. An isolation structure is formed on the semiconductor substrate. An original nitride layer having a substantial etch selectivity to the isolation structure is formed over the semiconductor substrate. A photoresist mask is formed for partially covering the original nitride layer. A wet etching is performed to remove the original nitride layer uncovered by the photoresist mask in such a way without causing substantial damage to the isolation structure. As such, the original nitride layer covered by the photoresist mask constitutes the resist protect layer.

23 Claims, 6 Drawing Sheets

METHOD FOR FORMING HIGH SELECTIVITY PROTECTION LAYER ON SEMICONDUCTOR DEVICE

BACKGROUND

The present invention relates generally to fabrication of semiconductor devices, and more particularly to a method for forming a resist protect layer that has an improved etch selectivity.

A silicide layer is usually formed atop silicon structures, such as polysilicon gates, source/drain regions and local interconnects, in a semiconductor device in order to reduce a sheet resistance. In the process of forming the silicide layer, a resist protect layer is used to cover some parts of the silicon structures and expose some predetermined areas. A metal layer is blanketly deposited over the resist protect layer and exposed areas. A thermal treatment is then performed to facilitate a chemical reaction where the metal layer is in contact with the silicon structures to form the silicide layer. Because the resist protect layer shields a part of the semiconductor device from the metal layer, no silicide layer would be formed on the covered portions in the course of the thermal treatment. The unreacted part of the metal layer is then stripped, leaving the silicide layer on desired areas.

Figure 1A:
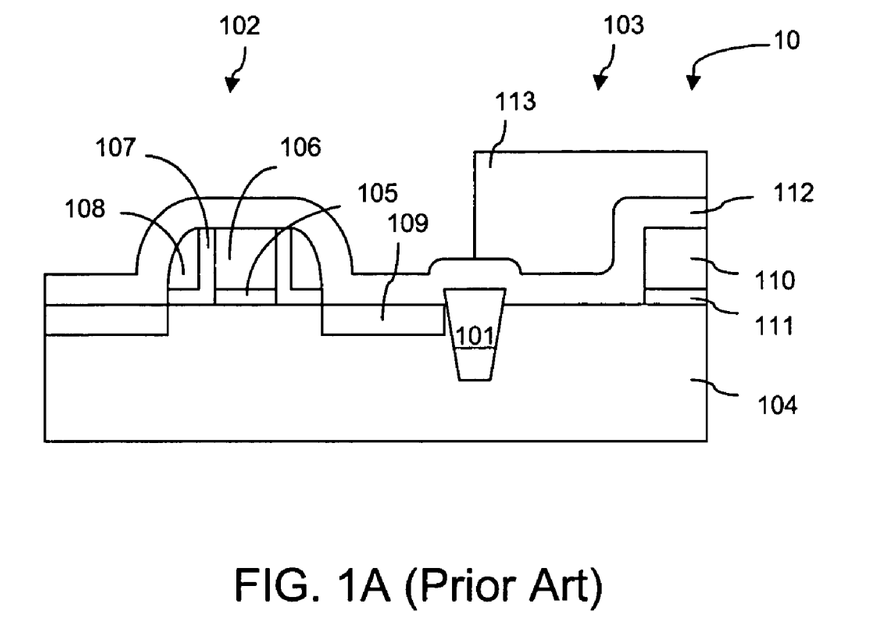
FIGS. 1A and 1B illustrate a conventional process for forming a resist protect layer on a semiconductor structure.

FIG. 1A illustrates a cross-sectional view of a semiconductor device 10 in a conventional fabrication process. A Shallow Trench Isolation (STI) 101 defines a first area 102 and second area 103 on a semiconductor substrate 104. In the first area 102, a gate oxide layer 105 separates a gate electrode 106 from the semiconductor substrate 104. Spacer liners 107 and spacers 108 are formed on the side walls of the gate electrode 106. Source/drain regions 109 are formed adjacent to the spacers 108 in the semiconductor substrate 104. In the second area 103, a resistor 110 and an insulator layer 111 is formed on the semiconductor substrate 104. A resist protect oxide layer 112 is blanketly deposited over the source/drain regions 109, spacers 108, spacer liners 107, gate electrode 106, STI 101 and resistor 110. A photoresist mask 113 is formed on the resist protect oxide layer 112 in such a way to cover the second area 103 and expose the first area 102.

Figure 1B:
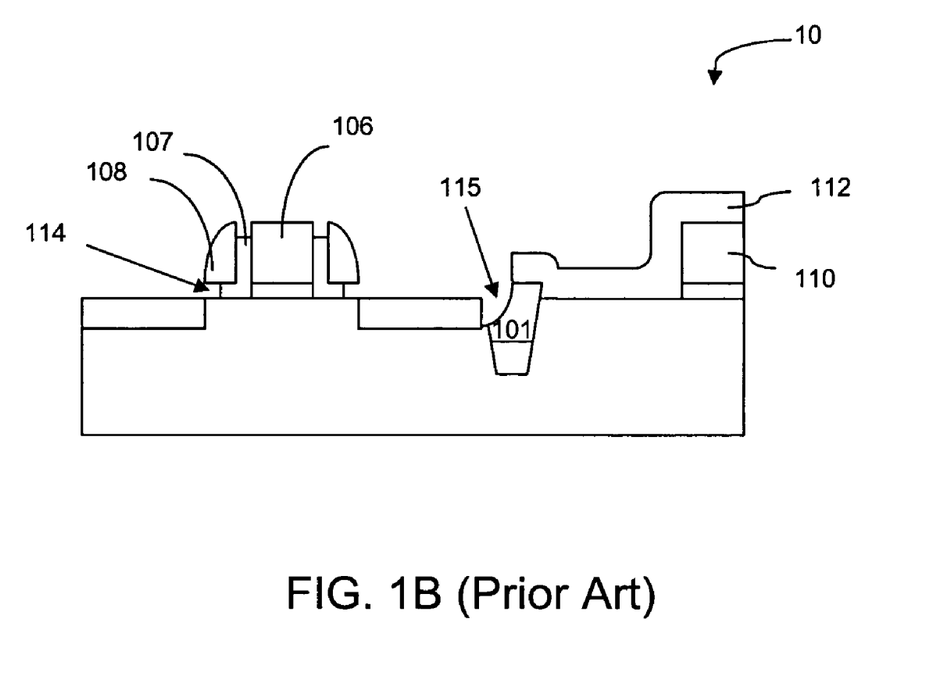

In the semiconductor device 10, only the gate electrode 106 and source/drain regions 109 require a formation of a silicide layer, so that it is desirable to remove the resist protect oxide layer 112 from the first area 102, while keeping it in the second area 110. Accordingly, a photoresist mask 113 is so defined to shield the second area 103 and expose the first area 102. A step of wet etching using an HF solution is performed to remove the exposed part of the resist protect oxide layer 112. Then the photoresist mask 113 is stripped off to leave the semiconductor structure 10, as shown in FIG. 1B.

The conventional process of forming the resist protect oxide layer 112 has a problem of undercutting the spacer liner 107, and damaging the STI 101. Because the spacer liners 107 and STI 101 are made of oxide materials, their etch rate would be very close to the resist protect oxide layer 112. In a 100:1 HF solution, the etch rate for the resist protect oxide layer 112 is about 70 Angstroms per minute, and the etch rates for the spacer liner 107 and the STI 101 are about 200 Angstroms per minute and 50 Angstroms per minute, respectively. Thus, using the HF solution to etch the resist protect oxide layer 112 is very unselective with respect to the spacer liners 107 and the STI 101. The undercut 114 and divot 115 are often formed after the wet etching process. This would degrade device performance, and cause junction leakage associated with a subsequently formed silicide layer.

Another problem of the conventional process is that the resist protect layer 112 left in the second area 103 is still vulnerable to etching by an HF solution in a subsequent pre-metal dip process. In a conventional salicide (Self-Aligned Silicide) process, the semiconductor structure 10 would be dipped in an HF solution to remove oxide residue and other contaminants before a metal layer is formed thereon. This may damage the remaining resist protect oxide layer 112, and cause an undesired silicide formation on the resistor 110.

Figure 2:
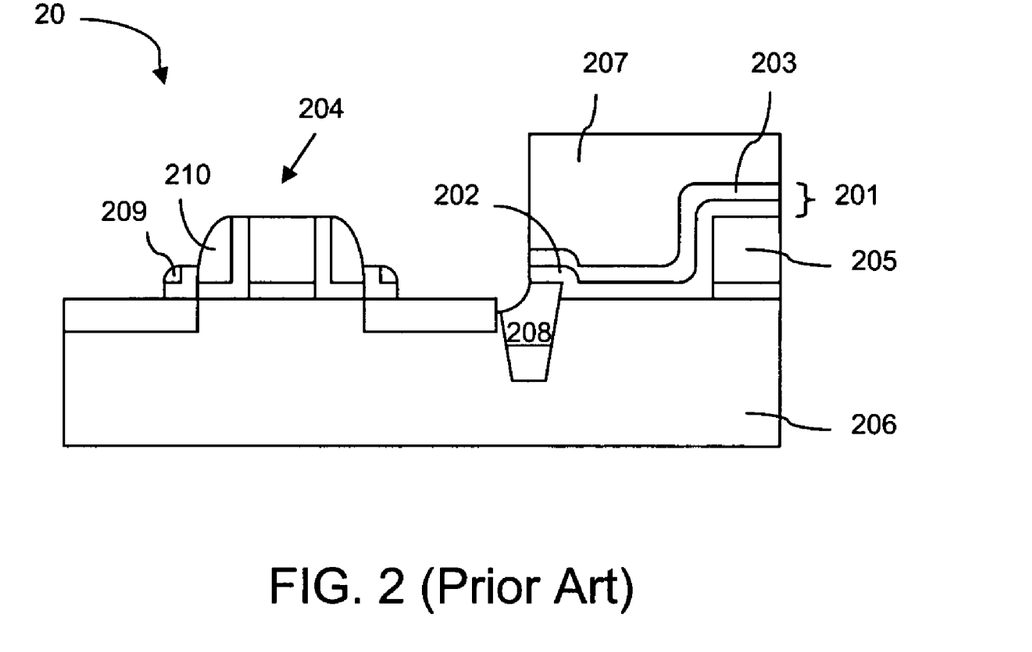
FIG. 2 illustrates an undesired residual structure resulting from another conventional process for forming a resist protect layer on a semiconductor structure.

FIG. 2 illustrates a resist protect layer formed on a semiconductor device 20, according to a conventional process. This process uses a stacked resist protect layer 201, which includes an oxide layer 202 and a nitride layer 203, blanketly deposited over a gate 204 and resistor 205 on a semiconductor substrate 206. A photoresist mask 207 covers the part of the stacked resist protect layer 201 above the resistor 205 and exposes the left part above the gate 204. A dry etching is performed to remove the part of the nitride layer 203 uncovered by the photoresist mask 207. Then, a wet etching using an HF solution is performed to remove the part of the oxide layer 205 uncovered by the photoresist layer 207. The process takes advantage of the nitride layer 203 to reduce the thickness of the oxide layer 202, so that the wet etching can be performed in a relatively short time. This reduces an undesirable impact, such as a formation of divot, that the HF solution may have on an STI 208.

While the process reduces the time required for the wet etching by using a thin oxide layer 202, it has some drawbacks. Due to the geometry of the semiconductor structure 20, the dry etching may not remove the uncovered nitride layer 203 completely. This results in a residual nitride layer 209 at the bottom corner of spacers 210. Furthermore, the dry etching usually involves gaseous chemicals and high energy ions. Given the thinness of the oxide layer 202, it is difficult to protect the semiconductor substrate 206 from damages by the chemicals and ions. In addition, the process requires not only two deposition steps for forming the nitride layer 203 and the oxide layer 202, but also a dry etching step and wet etching step for partially removing the same. This complicates the fabrication of semiconductor devices and results in a low throughput and high cost.

What is needed is a simple method for forming a resist protect layer on a semiconductor device without causing substantially structural damage and residuals.

SUMMARY

The present invention discloses a method for forming a resist protect layer on a semiconductor substrate. An isolation structure is formed on the semiconductor substrate. An original nitride layer, having a substantial etch selectivity to the isolation structure, is deposited over the semiconductor substrate. A photoresist mask is formed for partially covering the original nitride layer. A wet etching is performed to remove the original nitride layer uncovered by the photoresist mask in such a way without causing substantial damage to the isolation structure. As such, the original nitride layer covered by the photoresist mask constitutes the resist protect layer.

The construction and method of operation of the invention, however, together with additional objects and advantages thereof will be best understood from the following description of specific embodiments when read in connection with the accompanying drawings.

DESCRIPTION

The invention discloses a method for forming a resist protect layer on a semiconductor device in a fabrication process. First, an original nitride layer that has a high etch selectivity against oxide materials is formed over the semiconductor device according to a predetermined set of process conditions. A photoresist mask is formed on the original nitride layer to shield a part of it and expose another. A wet etching is performed to remove the part of the original nitride layer uncovered by the photoresist mask. Because the etching of the original nitride layer is highly selective against its neighboring oxide materials, structural damages, such as undercuts and divots, would not occur after the wet etching is finished.

FIGS. 3 through 10 graphically illustrate a process for forming a resist protect layer on a semiconductor device according to one embodiment of the present invention. Like numerals will be used to indicate like structures throughout these figures.

Figure 3:
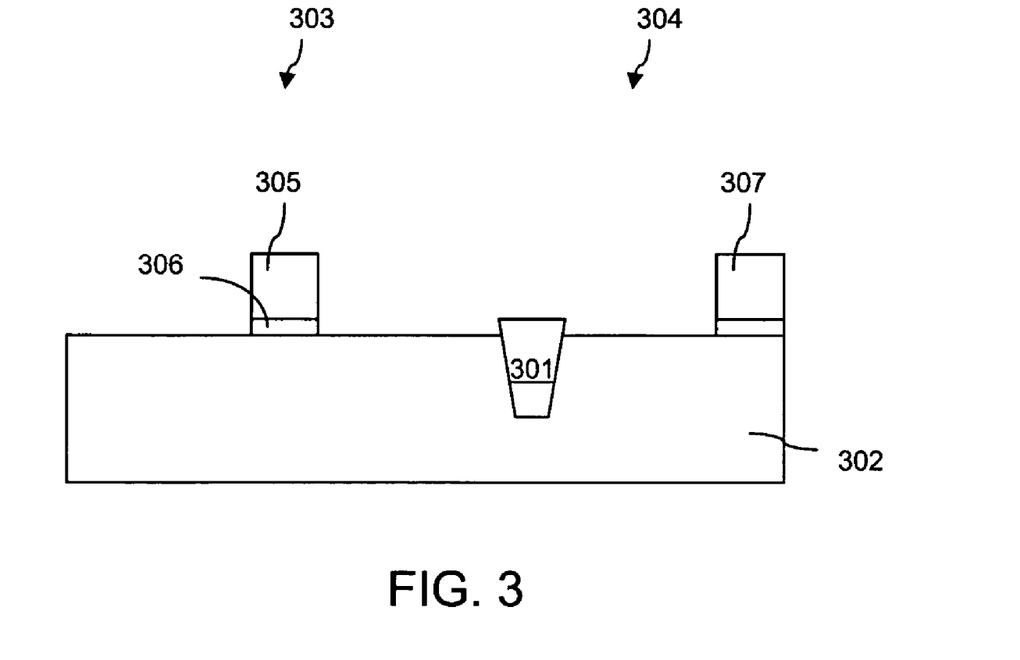
FIG. 3 illustrates a cross-sectional view of a gate electrode and resistor on a semiconductor substrate, in accordance with one embodiment of the present invention as illustrated in FIG. 3.

Referring to FIG. 3, an isolation 301 is formed on a semiconductor substrate 302 to define a first area 303 and a second area 304. The isolation 301 includes, but not limited to, an STI and LOCal Oxidation of Silicon (LOCOS) isolation. The STI can be formed by steps of photolithography, trench etching and trench filling with an oxide layer. The LOCOS isolation can be formed by steps of depositing a protective nitride layer and locally oxidizing parts of a semiconductor substrate uncovered by the protective nitride layer. A gate oxide 306 is formed on the semiconductor substrate 302 in the first area 303. A gate electrode 305 is stacked atop the gate oxide 306. A resistor 307 is formed on the semiconductor substrate 302 in the second area 304.

Figure 4:
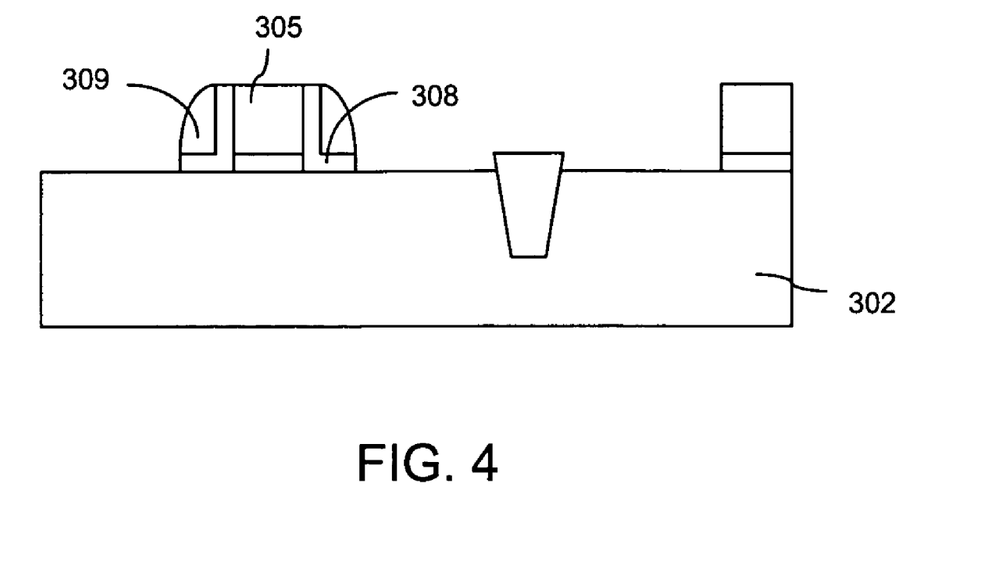
FIG. 4 illustrates a cross-sectional view of spacers and spacer liners formed on the side walls of the gate electrode, in accordance with the embodiment of the present invention as illustrated in FIG. 3.

Referring to FIG. 4, a spacer liner oxide 308 is formed on the side walls of the gate electrode 305 by steps, such as deposition, oxidation, photolithography and etching. The completely formed spacer liner oxide 308 extends from the side walls of the gate electrode 305 along the surface of the semiconductor substrate 302 for a short distance. Spacers 309 are formed according to the geometry of the spacer liner oxide 308. A nitride layer is first deposited on the gate electrode 309 and the spacer liners 308. Then, an anisotropic etching is performed to remove an excessive part of the nitride layer and leave it as the spacers 309 shown in this figure.

Figure 5:
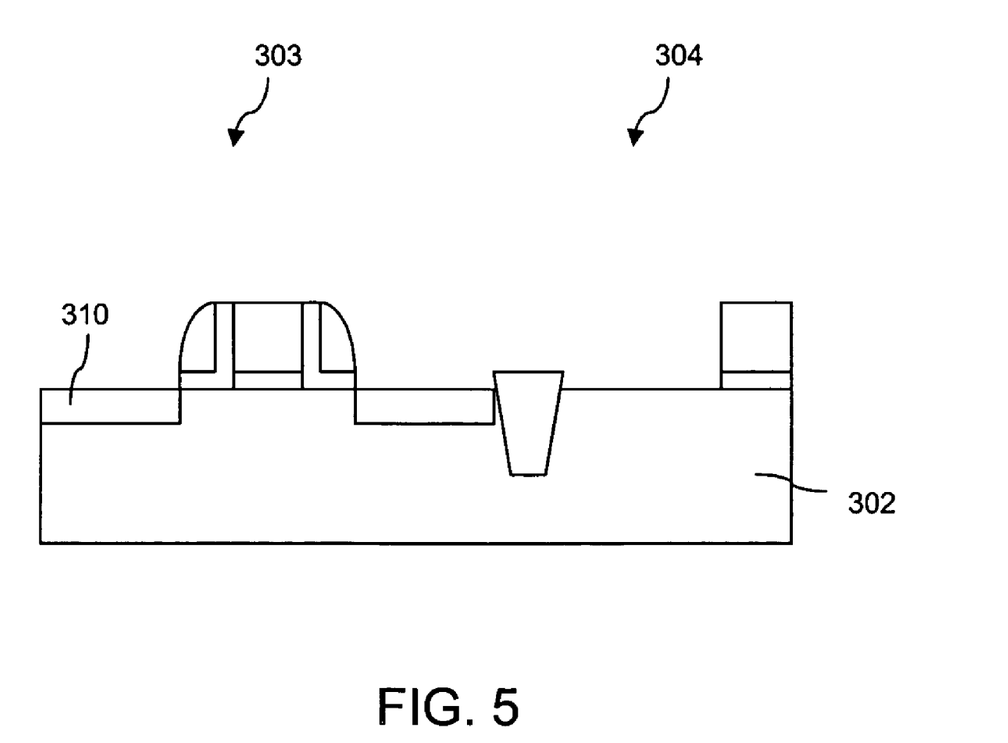
FIG. 5 illustrates a cross-sectional view of a source and drain region formed adjacent to the gate electrode in the semiconductor substrate, in accordance with the embodiment of the present invention as illustrated in FIG. 3.

Referring to FIG. 5, source/drain regions 310 are formed adjacent to the spacers 309 in the semiconductor substrate 302. In forming the source/drain regions 309, a photolithography is performed to shield the second area 304. An ion implantation is performed to implant a heavy dosage of dopants into the semiconductor substrate 302. Conventionally, a step of annealing would be performed immediately following the ion implantation. However, the present invention suggests performing the annealing several steps later for benefiting a formation of a resist protect layer. The detail will be explained below. Note that while performing ion implantation and annealing in a consecutive order is not suggested, it is still an option for the present invention, and, therefore, falls in the scope of the same.

Figure 6:
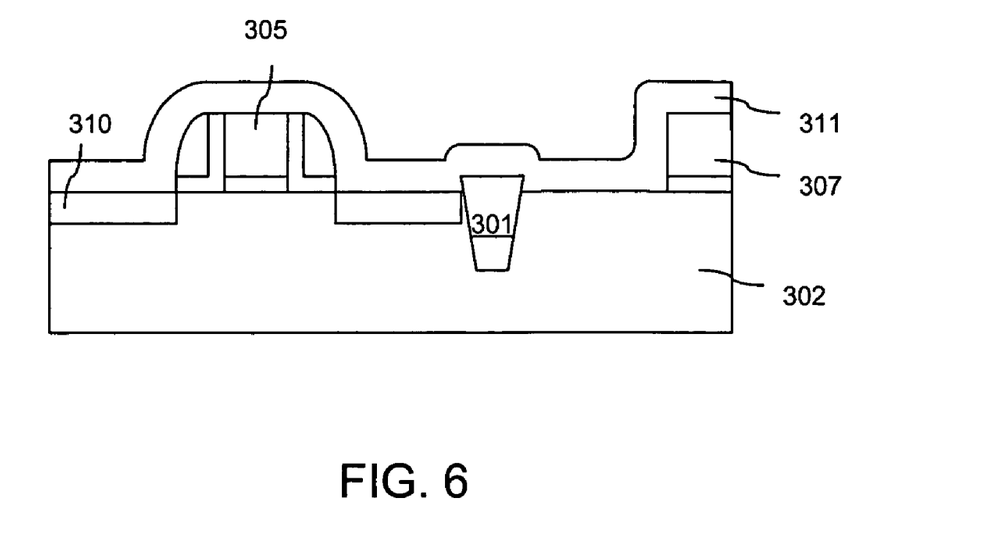
FIG. 6 illustrates a cross-sectional view of an original nitride layer formed over the gate electrode and the resistor on the semiconductor substrate, in accordance with the embodiment of the present invention as illustrated in FIG. 3.

Referring to FIG. 6, an original nitride layer 311 is blanketly deposited over the gate electrode 305, source/drain regions 310, isolation 301 and resistor 307. By using the term "original," it suggests that the original nitride layer 311 will be further processed as a resist protect layer in the following steps. The etch rate of the original nitride layer for a certain etching solution can be adjusted by optimizing process conditions, such as temperature, pressure, flow, precursor and deposition methods. It is understood that the etch rate increases when the temperature decreases and the pressure as well as flow increases. Thus, by performing a deposition in a relatively low temperature with other process conditions properly adjusted, the original nitride layer 311 can achieve a high etch rate.

In this embodiment, the composition of the original nitride layer 311 includes, but not limited to, silicon nitride, oxynitride, and a nitride layer doped with carbon, boron, Ge, As, etc. The step of deposition may be Low Pressure Chemical Vapor Deposition (LPCVD), Rapid Thermal Chemical Vapor Deposition (RTCVD), Plasma-Enhanced Chemical Vapor Deposition (PECVD) or Atomic Layer Deposition (ALD). The temperature is suggested to be lower than 600 degrees Celsius, and is preferably between 400 to 500 degrees Celsius. The suggested pressure is between 0.1 and 10 torrs. The precursor used can be $Si_2Cl_6$, $Si_2H_6$, $SiH_2Cl_2$ or BTBAS, but preferably $Si_2Cl_6$. The thickness of the original nitride layer 311 is suggested to be from 10 to 1000 Angstroms, and preferably from 50 to 200 Angstroms. For example, an original nitride layer 311 is formed by using $NH_3$ and $Si_2Cl_6$ as precursors in an LPCVD process at a temperature between 450 and 500 degrees Celsius and a pressure between 0.1 and 5 torrs. The original nitride layer 311 can achieve an etch rate greater than 700 Angstroms per minute in a 100:1 HF solution.

Figure 7:
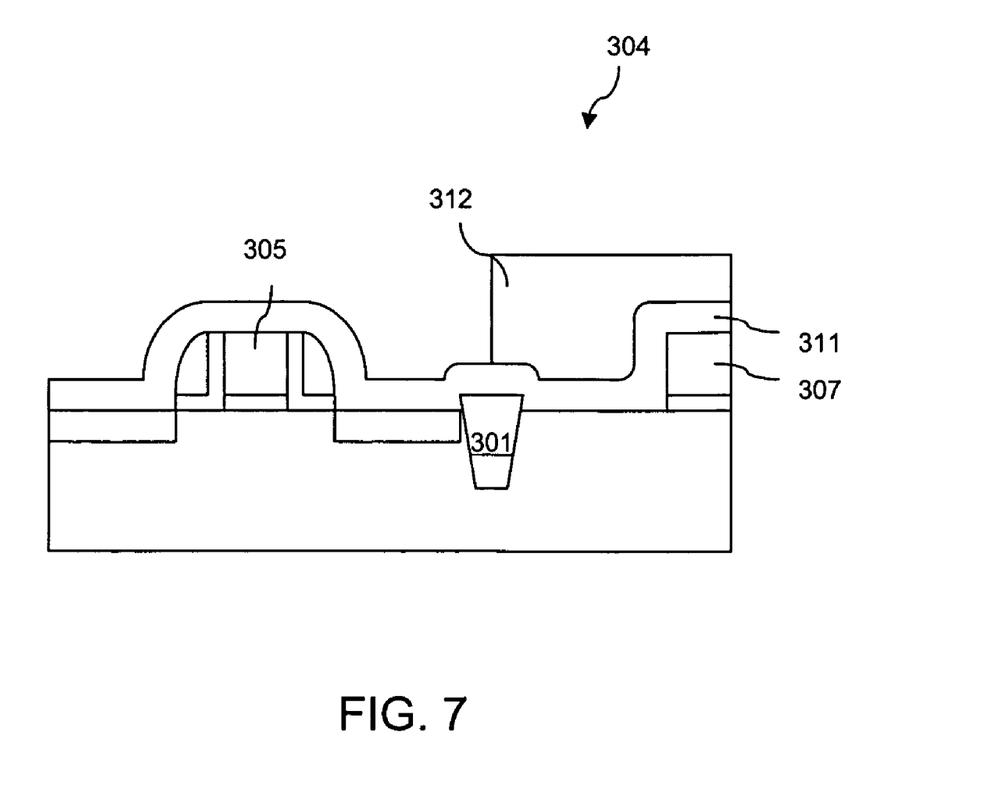
FIG. 7 illustrates a cross-sectional view of a photoresist mask partially exposing the original nitride layer, in accordance with the embodiment of the present invention as illustrated in FIG. 3.

Referring to FIG. 7, a photoresist mask 312 is formed on the original nitride layer 311 in the second area 304. The photoresist mask 312 functions as an etching mask to shield a part of the original nitride layer 311 from reaction with etching chemicals, and expose another to the same.

Figure 8:
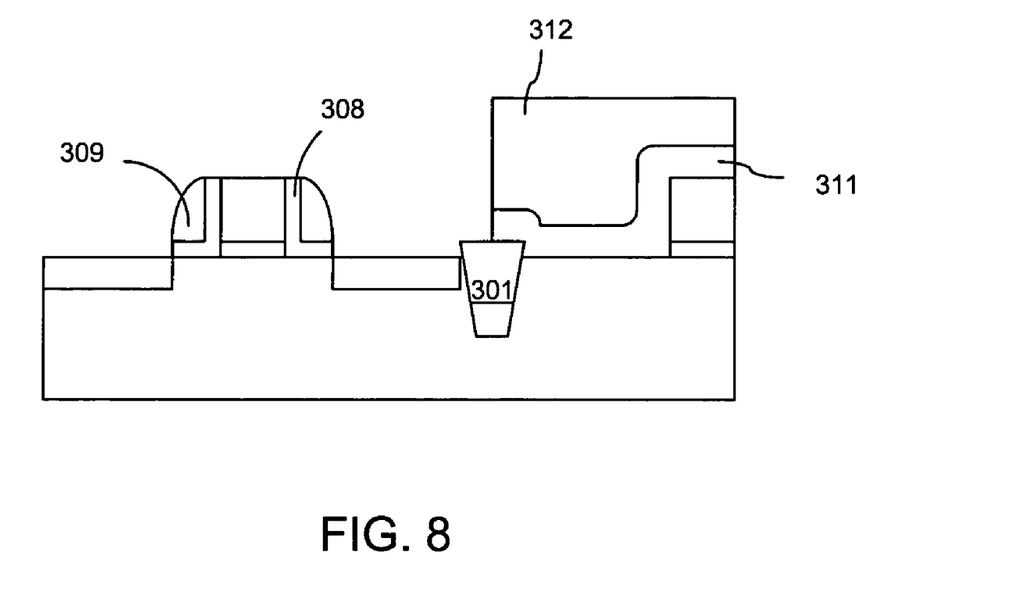
FIG. 8 illustrates a cross-sectional view of a part of the resist protect nitride layer removed from the semiconductor substrate, in accordance with the embodiment of the invention as illustrated in FIG. 3.

Referring to FIG. 8, the part of the original nitride layer 311 uncovered by photoresist mask 312 is etched off. In the embodiment so illustrated here, a wet etching is preferred, while a dry etching may also be used. Because the original nitride layer 311 is formed with process conditions adjusted, it can achieve a high etch rate with respect to certain chemicals. Such chemicals are not necessarily effective in etching the oxide materials, such as spacer liner oxide 308, and isolation 301. The etch rate of the original nitride layer 311 is much higher than that of the spacers 309, even though they are also made of silicon nitride. This is because the spacers 309 are formed in much different conditions, such as a higher temperature. Thus, etching the original nitride layer 311 is highly selective to the spacer liner oxide 308, spacers 309 and isolation 301. As such, the part of the original nitride layer 311 uncovered by a photoresist mask 312 can be easily removed without undercutting the spacer liner oxide 308 or causing a divot to the isolation 301.

For example, the original nitride layer 311 formed in the above-mentioned conditions has an etch rate greater than 700 Angstroms per minute in a 100:1 HF solution. In the same HF solution, the spacer liner oxide 308 has an etch rate about 200 Angstroms per minute, and the isolation 301 has an etching rate about 50 Angstroms per minute. In other words, the etch rate of the original nitride layer is about 4 times faster than the spacer liner oxide 308, and about 14 times faster than the isolation 301.

Figure 9:
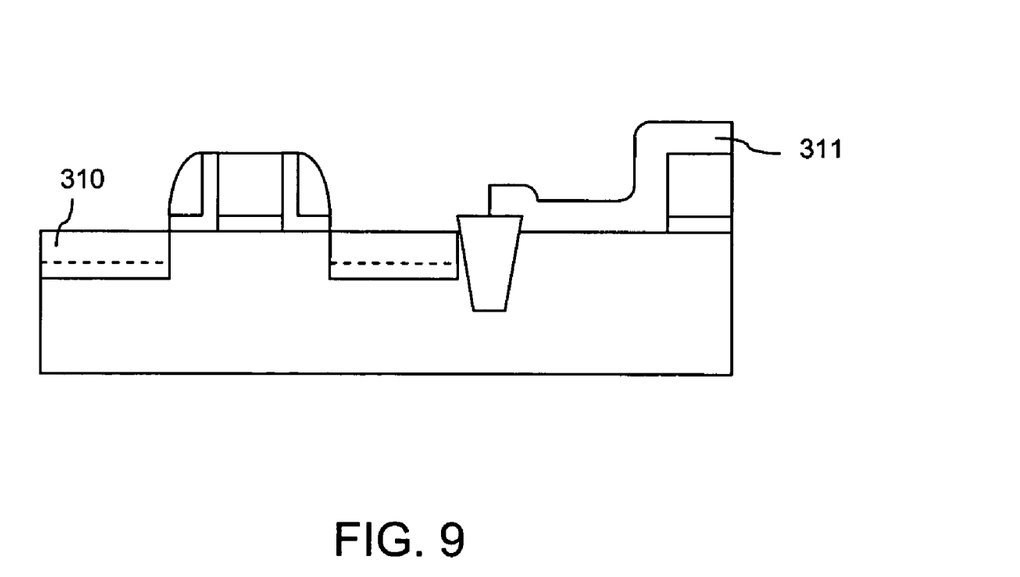
FIG. 9 illustrates a cross-sectional view of junctions of source/drain regions expanded after annealing, in accordance with the embodiment of the present invention as illustrated in FIG. 3.

Referring to FIGS. 8 and 9, after the photoresist mask 312 is stripped, a step of annealing is performed to diffuse the implanted dopants for expanding the junctions of the source/drain regions 310. The annealing may be a step of Rapid Thermal Annealing (RTA), spike annealing, furnace annealing and laser annealing. The temperature is controlled in a range from 700 to 1100 degrees Celsius for a period of time no greater than 10 hours. It is preferable that the annealing is a RTA at a temperature from 1000 to 1100 degrees Celsius. The annealing densifies the original nitride layer 311 to become a resist protect layer, which has a much lower etch rate with respect to certain chemicals, such as HF. The resist protect layer 311 is an excellent barrier layer for a subsequent pre-metal HF dip step that is often performed to remove oxide residues and other contaminants.

Figure 10:
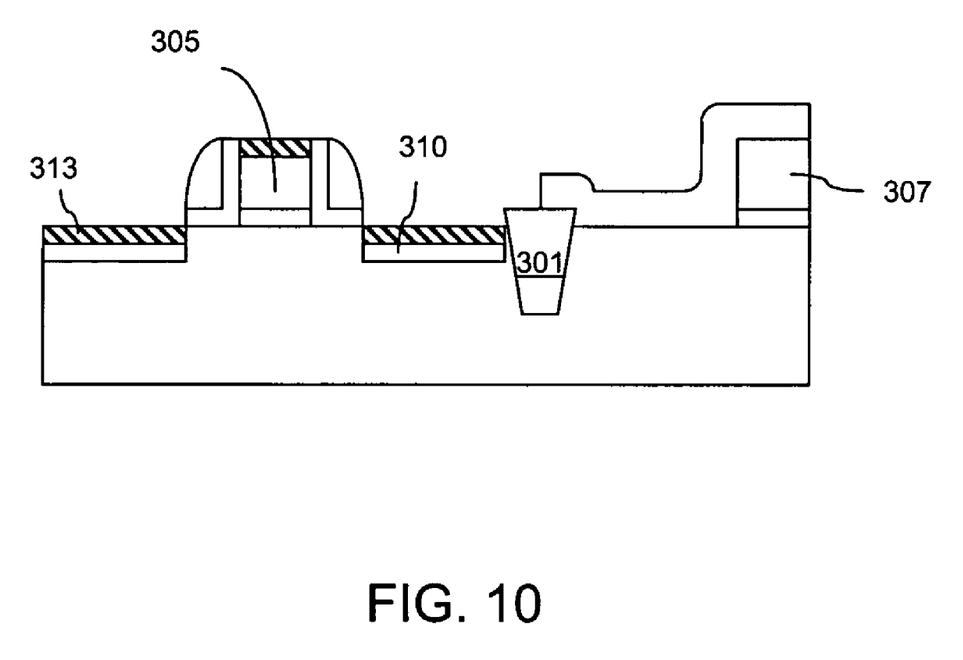
FIG. 10 illustrates a cross-sectional view of a silicide layer formed atop the gate electrode and source/drain regions, in accordance with the embodiment of the present invention as illustrated in FIG. 3.

Referring to FIG. 10, a silicide layer 313 is formed atop the gate electrode 305 and the source/drain regions 310. The resist protect layer 311 protects the resistor 307 from a formation of a silicide layer thereon.

As the semiconductor technology advances, a junction in a semiconductor device becomes shallower. The deposition thermal budget should be carefully controlled to avoid undesired expansion of the junction caused by diffusion of dopants. Because the original nitride layer is formed in a relatively low temperature, this invention has no adverse impact on the shallow junction. In addition, the resist protect layer proposed by the present invention has the advantages of excellent step coverage and pattern loading effect. Compared to the conventional stacked resist protect layer approach that requires dry etching and wet etching steps, the invention is much simpler for only one etching step is needed. As such, the invention provides a higher throughput and lower costs.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for forming a resist protect layer on a semiconductor substrate, the method comprising:

forming an isolation structure on the semiconductor substrate;

depositing an original nitride layer over the semiconductor substrate, the original nitride layer having an etch rate greater than an etch rate of further nitride structures formed from a further nitride layer on the semiconductor substrate in an etching solution and substantially greater than an etch rate of the isolation structure in the etching solution, the original nitride layer formed using different process conditions than the further nitride layer;

forming a photoresist mask for partially covering the original nitride layer; and wet etching in the etching solution to remove the original nitride layer uncovered by the photoresist mask, wherein the original nitride layer serves as the resist protect layer for shielding a predetermined area from metalization.

2. The method of claim 1 wherein the original nitride layer is made of silicon nitride, oxynitride, nitride doped with carbon, nitride doped with boron, nitride doped with Ge, or nitride doped with As.

3. The method of claim 1 wherein the original nitride layer has a thickness between 10 and 1000 Angstroms.

4. The method of claim 1 wherein the depositing is performed at a temperature lower than 600 degrees Celsius.

5. The method of claim 1 wherein the depositing is performed under a pressure between 0.1 and 10 torrs.

6. The method of claim 1 wherein the depositing uses a precursor selected from a group consisting of $Si_2Cl_6$, $Si_2H_6$, $SiH_2Cl_2$, $NH_3$ and BTBAS.

7. The method of claim 1 wherein the wet etching uses an HF solution.

8. The method of claim 1 further comprising removing the photoresist mask.

9. The method of claim 8 further comprising annealing the semiconductor substrate to densify the original nitride layer after the photoresist mask is removed.

10. The method of claim 9 wherein the annealing diffuses a plurality of dopants pre-implanted in the semiconductor substrate to form source/drain regions.

11. The method of claim 8 wherein the annealing is performed at a temperature between 700 and 1100 degrees Celsius.

12. The method of claim 8 wherein the annealing is performed for a period of time less than 10 hours.

13. A method for forming a resist protect layer for a sulicidation process on a semiconductor substrate, the method comprising:

forming an isolation structure in the semiconductor substrate;

forming an original nitride layer over the semiconductor substrate at a formation temperature lower than 600 degrees Celsius, such that the original nitride layer has a higher etch rate than the isolation structure in a wet etching solution;

forming a photoresist mask for partially covering the original nitride layer; and wet etching to remove the original nitride layer uncovered by the photoresist mask in the wet etching solution without causing substantial damage to the isolation structure; and removing the photoresist mask.

14. The method of claim 13 further comprising annealing the semiconductor substrate to densify the original nitride layer for serving as the resist protect layer that has an etch rate lower than the original nitride layer, after the photoresist is removed.

15. The method of claim 13 wherein the original nitride layer is made of silicon nitride, oxynitride, nitride doped with carbon, nitride doped with boron, nitride doped with Ge, or nitride doped with As.

16. The method of claim 13 wherein the original nitride layer has a thickness between 10 and 1000 Angstroms.

17. The method of claim 13 wherein the forming an original nitride layer is performed under a pressure between 0.1 and 10 torrs.

18. The method of claim 13 wherein the forming an original nitride layer uses a precursor selected from a group consisting of $Si_2Cl_6$, $Si_2H_6$, $SiH_2Cl_2$, $NH_3$ and BTBAS.

19. The method of claim 13 wherein the wet etching uses an HF solution.

20. The method for forming a resist protect layer for a silicidation process on a semiconductor substrate as in claim 13, wherein the forming an isolation structure in the semiconductor substrate comprises forming an oxide isolation structure; and the wet etching to remove the original nitride layer comprises wet etching with an HF solution;

and further comprising annealing the semiconductor substrate to densify the original nitride layer at a second temperature, the second temperature being higher than the formation temperature.

21. The method of claim 20 wherein the original nitride layer has a thickness between 10 and 1000 Angstroms.

22. The method of claim 20 wherein the depositing is performed under a pressure between 0.1 and 10 torrs.

23. The method of claim 20 wherein the forming an original nitride layer uses a precursor selected from a group consisting of $Si_2Cl_6$, $Si_2H_6$, $SiH_2Cl_2$, $NH_3$ and BTBAS.

* * * * *

UNITED STATES PATENT AND TRADEMARK OFFICE
CERTIFICATE OF CORRECTION

PATENT NO.       : 7,316,970 B2  Page 1 of 1
APPLICATION NO. : 10/892014
DATED            : January 8, 2008
INVENTOR(S)      : Chien-Hao Chen et al.

It is certified that error appears in the above-identified patent and that said Letters Patent is hereby corrected as shown below:

Column 6, line 64, delete "sulicidation" and insert -- silicidation -- therefor.

Signed and Sealed this

Sixth Day of May, 2008

JON W. DUDAS
*Director of the United States Patent and Trademark Office*